United States Patent
Jeong

(10) Patent No.: US 9,467,102 B2
(45) Date of Patent: Oct. 11, 2016

(54) MULTI-BAND AMPLIFIER, METHOD FOR CONTROLLING THEREOF

(71) Applicant: SAMSUNG ELECTRO-MECHANICS CO., LTD., Suwon-Si, Gyeonggi-Do (KR)

(72) Inventor: Chan Yong Jeong, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/616,591

(22) Filed: Feb. 6, 2015

(65) Prior Publication Data

US 2015/0365054 A1    Dec. 17, 2015

(30) Foreign Application Priority Data

Jun. 12, 2014  (KR) .................. 10-2014-0071133

(51) Int. Cl.
| | |
|---|---|
| *H04B 1/00* | (2006.01) |
| *H03F 3/19* | (2006.01) |
| *H04B 7/04* | (2006.01) |
| *H04W 4/00* | (2009.01) |
| *H04B 1/44* | (2006.01) |
| *H03F 3/68* | (2006.01) |
| *H03F 3/72* | (2006.01) |

(52) U.S. Cl.
CPC *H03F 3/19* (2013.01); *H03F 3/68* (2013.01); *H03F 3/72* (2013.01); *H04B 1/0064* (2013.01); *H04B 1/44* (2013.01); *H04B 7/0413* (2013.01); *H04W 4/008* (2013.01); H03F 2200/111 (2013.01); H03F 2200/421 (2013.01); H03F 2200/451 (2013.01); H03F 2200/555 (2013.01); H03F 2203/7209 (2013.01); H03F 2203/7236 (2013.01); H03F 2203/7239 (2013.01)

(58) Field of Classification Search
USPC ........ 455/78, 552.1, 247.1, 556.1, 558, 144, 455/132, 253.2, 83, 168.1; 330/297, 253, 330/296, 51, 53, 126
See application file for complete search history.

(56) References Cited

U.S. PATENT DOCUMENTS

| | | | |
|---|---|---|---|
| 2006/0189286 A1* | 8/2006 | Kyu ........................ | H03F 3/19 455/144 |
| 2009/0096531 A1* | 4/2009 | Shimamoto ........... | H03F 1/0216 330/297 |
| 2010/0136939 A1* | 6/2010 | Kim .................... | H04L 27/2647 455/247.1 |
| 2013/0052968 A1* | 2/2013 | Popplewell ............ | H04B 15/06 455/78 |
| 2014/0300417 A1* | 10/2014 | Xu ......................... | H03F 1/342 330/278 |

FOREIGN PATENT DOCUMENTS

| | | |
|---|---|---|
| KR | 10-2005-0043525 A | 5/2005 |
| KR | 10-2010-0077726 A | 7/2010 |

* cited by examiner

*Primary Examiner* — Ganiyu A Hanidu
(74) *Attorney, Agent, or Firm* — NSIP Law

(57) ABSTRACT

A multi-band amplifier may include: a first amplifying unit connected to a first antenna stage; a second amplifying unit connected to a second antenna stage; and a switching control unit generating a control signal to activate at least one of the first and second amplifying units depending on a plurality of control voltages, wherein the first amplifying unit amplifies the signal within the first frequency band or provides the signal within the first frequency band to the first antenna stage by performing a switching operation depending on the control signal, and the second amplifying unit amplifies the signal within the second frequency band or provides the signal within the second frequency band to the second antenna stage by performing a switching operation depending on the control signal.

12 Claims, 15 Drawing Sheets

| Parameter | | Single LNA/SW | Dual-band SPEC | This work |
|---|---|---|---|---|
| Supply current | | 9.19 | 9 | 9.05 |
| RX high gain | Gain | 15.97 | 14(12~16) | 14.19 |
| | NF | 1.85 | 2.0 | 1.95 |
| | Input IP3 | -2.65 | 3 | -1.84 |
| | Input P1dB | -11.99 | – | -11.85 |
| | Input RL | -13.95 | -10 | -15.77 |
| | Output RL | -18.73 | -10 | -13.63 |
| RX low gain | Gain | -9.07 | -6(-8~-4) | -9.76 |
| | Input RL | -18.07 | -10 | -19.29 |
| | Output RL | -17.75 | -10 | -19.27 |
| BT | IL | 0.44 | 0.60 | 0.43 |
| | Input RL | -21.11 | -15 | -21.04 |
| | Output RL | -21.67 | -15 | -21.60 |
| | Input P1dB | 29.48 | 28 | 28.28 |
| TX | IL | 0.44 | 0.60 | 0.43 |
| | Input RL | -21.70 | -15 | -21.60 |
| | Output RL | -21.14 | -15 | -21.04 |
| | Input P1dB | 30.09 | 32 | 30.18 |

FIG. 9A

| Parameter | | Single LNA/SW | Dual-band SPEC | This work |
|---|---|---|---|---|
| Supply current | | 10.11 | 10 | 10.0 |
| RX high gain | Gain | 15.1 | 13(11~15) | 12.48 |
| | NF | 1.91 | 2.5 | 2.04 |
| | Input IP3 | 3.45 | 3 | 3.92 |
| | Input P1dB | -6.52 | - | -5.35 |
| | Input RL | -24.38 | -10 | -27.22 |
| | Output RL | -20.18 | -10 | -10 |
| RX low gain | Gain | -10.14 | -7(-9~-5) | -10.1 |
| | Input RL | -14.8 | -10 | -15.05 |
| | Output RL | -12.98 | -10 | -13.55 |
| TX | IL | 0.54 | 0.60 | 0.54 |
| | Input RL | -16.57 | -15 | -17.13 |
| | Output RL | -16.57 | -15 | -16.68 |
| | Input P1dB | 30.7 | 32 | 31.78 |

FIG. 9B

MULTI-BAND AMPLIFIER, METHOD FOR CONTROLLING THEREOF

CROSS-REFERENCE TO RELATED APPLICATION

This application claims the benefit of Korean Patent Application No. 10-2014-0071133 filed on Jun. 12, 2014, with the Korean Intellectual Property Office, the disclosure of which is incorporated herein by reference.

BACKGROUND

The present disclosure relates to a multi-band amplifier, a method for controlling thereof, and a multi-band amplifier for a multiple-input and multiple-output (MIMO) system.

As a wireless communications technology has developed, single smart devices have been provided with the ability to utilize a range of communications standards. For example, in the area of a cellular communications, the Long Term Evolution (LTE), or 4 G, standard may be used by a single smart device, in addition to existing 2 G and 3 G communications standards. In the area of Wi-Fi communications, the new 802.11ac Wi-Fi standard may be used by the single smart device, in addition to the existing 802.11a/b/g/n Wi-Fi standard.

Here, communications using the 802.11ac standard may be carried out within bandwidths of 20, 40, 80 and 160 MHz in the frequency band of 5 GHz. Therefore, a dual band (2.4 GHz/5 GHz) technique that supports Wi-Fi communications within the frequency band of 5 GHz in addition to Wi-Fi communications within to the existing frequency band of 2.4 GHz has been introduced.

A front-end module influences radio frequency (RF) performance in a Wi-Fi-enabled product, and such a front-end module commonly includes a low noise amplifier (LNA), a switch, and a power amplifier (PA).

In this case, in a dual band technique according to the related art, such low noise amplifiers and switches are configured by two dies, forming a single structure separately operated in the 2.4 GHz and 5 GHz frequency bands.

RELATED ART DOCUMENT (Patent Document 1) Korean Patent Laid-Open Publication No. 10-2010-0077726

SUMMARY

An exemplary embodiment in the present disclosure may provide a multi-band amplifier, a method for controlling thereof, and a multi-band amplifier for a multiple-input and multiple-output (MIMO) system configuring signals within two frequency bands using signal paths formed independently of each other in a single substrate and controlling switching operations of the signal paths using a minimum control voltage.

According to an exemplary embodiment in the present disclosure, a multi-band amplifier may include: a first amplifying unit connected to a first antenna stage so as to transmit and receive a signal within a first frequency band; a second amplifying unit connected to a second antenna stage so as to transmit and receive a signal within a second frequency band; and a switching control unit generating a control signal to activate at least one of the first amplifying unit and the second amplifying unit depending on a plurality of control voltages, wherein the first amplifying unit amplifies the signal within the first frequency band or provides the signal within the first frequency band to the first antenna stage by performing a switching operation depending on the control signal, and the second amplifying unit amplifies the signal within the second frequency band or provides the signal within the second frequency band to the second antenna stage by performing a switching operation depending on the control signal.

According to another exemplary embodiment in the present disclosure, a multi-band amplifier may include: a first switching unit transmitting and receiving a signal within a first frequency band through a switching operation between a first antenna stage and a transmission and reception path of the signal within the first frequency band; a second switching unit transmitting and receiving a signal within a second frequency band through a switching operation between a second antenna stage and a transmission and reception path of the signal within the first frequency band; and a switching control unit positioned between the first switching unit and the second switching unit and generates first to eighth control signals for controlling the switching operation of the first or second switching unit depending on first to fourth control voltages provided by an external source.

According to another exemplary embodiment in the present disclosure, a method for controlling a multi-band amplifier may include: receiving first to fourth control voltages from an external source; generating first to eighth control signals depending on the first to fourth control voltages; activating at least one of first amplifying unit and the second amplifying unit by performing a switching operation depending on the first to eighth control signals; and amplifying a signal within a first frequency band provided by a first antenna stage when the first amplifying unit is activated and amplifying a signal within a second frequency band provided by a second antenna stage when the second amplifying unit is activated.

According to another exemplary embodiment in the present disclosure, a multi-band amplifier of a multiple-input and multiple-output (MIMO) system may include: a first amplifying module including a first amplifying unit amplifying a signal within a first frequency band provided by a first antenna stage, a second amplifying unit amplifying a signal within a second frequency band provided by a second antenna stage, and a first switching control unit generating a first unit control signal to activate at least one of the first amplifying unit and the second amplifying unit depending on a plurality of first unit control voltages; a second amplifying module including a third amplifying unit amplifying a signal within a first frequency band provided by a third antenna stage, a fourth amplifying unit amplifying a signal within a second frequency band provided by a fourth antenna stage, and a second switching control unit generating a second unit control signal to activate at least one of the third and fourth amplifying units depending on a plurality of second unit control voltages; and a wireless communications module electrically connected to the first amplifying module and the second amplifying module so as to transmit and receive the signals within the first and second frequency bands, wherein the first amplifying unit amplifies the signal within the first frequency band provided by the first antenna stage by performing a switching operation depending on the first unit control signal and the second amplifying unit amplifies the signal within the second frequency band provided by the second antenna stage by performing a switching operation depending on the first unit control signal, and the third amplifying unit amplifies the signal within the first frequency band provided by the third antenna stage by performing a switching operation depending on the second unit control signal and the fourth amplifying unit amplifies the signal within the second frequency band provided by the fourth antenna stage by performing a switching operation depending on the second unit control signal.

BRIEF DESCRIPTION OF DRAWINGS

The above and other aspects, features and other advantages of the present disclosure will be more clearly understood from the following detailed description taken in conjunction with the accompanying drawings, in which:

FIG. 9A is a table comparing results obtained by simulating a multi-band amplifier according to an exemplary embodiment in the present disclosure and an amplifier (LNA/SW) according to the related art at a signal within 2.4 GHz;

FIG. 9B is a table comparing results obtained by simulating the multi-band amplifier according to an exemplary embodiment in the present disclosure and the amplifier (LNA/SW) according to the related art at a signal within 5 GHz;

DETAILED DESCRIPTION

Figure 1:
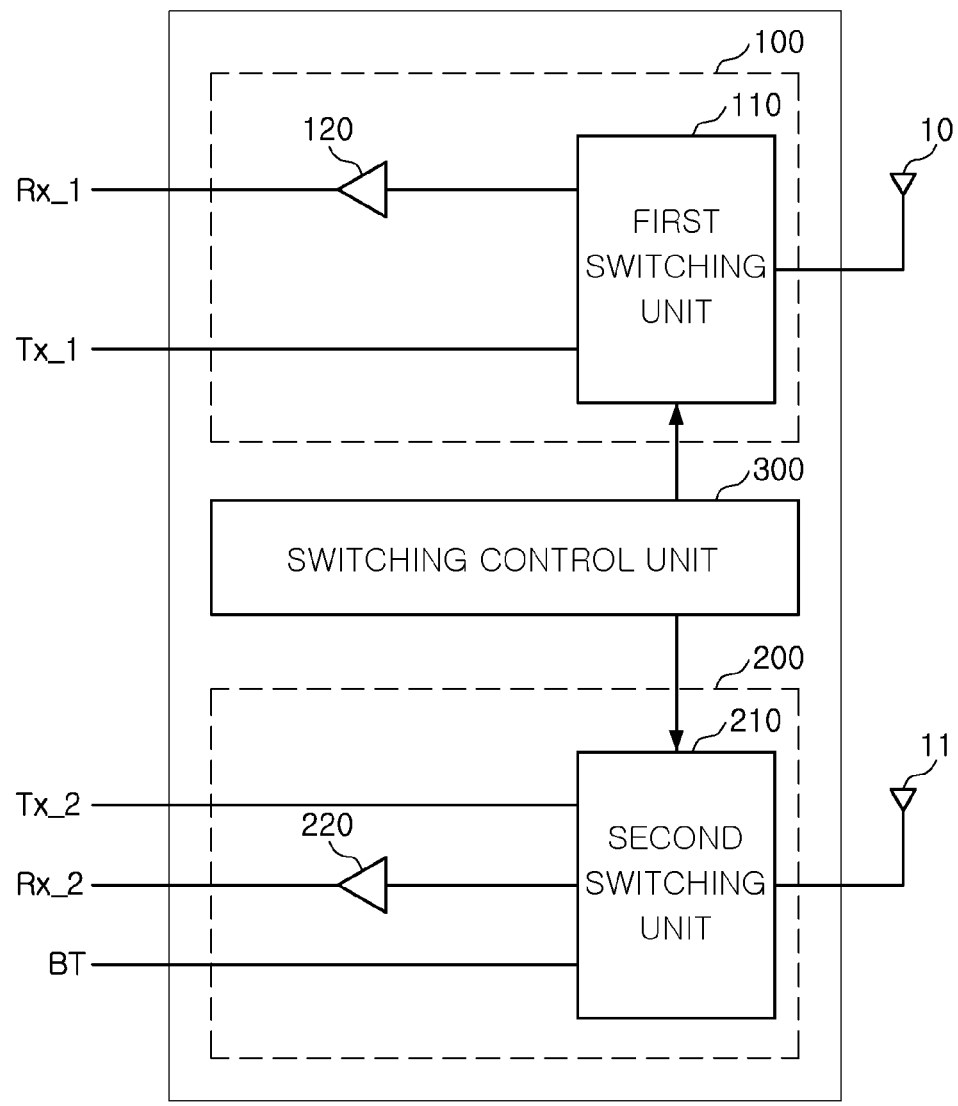
FIG. 1 is a block diagram illustrating a multi-band amplifier according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

Throughout the drawings, the same or like reference numerals will be used to designate the same or like elements.

FIG. 1 is a block diagram illustrating a multi-band amplifier according to an exemplary embodiment in the present disclosure.

Referring to FIG. 1, a multi-band amplifier according to the present disclosure may include a first amplifying unit 100, a second amplifying unit 200, and a switching control unit 300.

The first amplifying unit 100 may be connected to a first antenna stage 10 and may amplify a signal within a first frequency band provided by the first antenna stage 10. The first amplifying unit 100 may also perform a switching operation in response to a control signal provided by the switching control unit 300 so as to transmit and receive the signal within the first frequency band.

More specifically, the first amplifying unit 100 may include a first switching unit 110 and a first amplifier 120. The first switching unit 110 may be positioned between the first antenna stage 10 and the first amplifier 120 and may select transmission and reception paths Tx_1 and Rx_1 of the signal within the first frequency band through a switching operation.

For example, the first amplifying unit 100 may also transmit the signal within the first frequency band to the first antenna stage 10 through the switching operation of the first switching unit 110 and may also amplify the signal within the first frequency band provided through the first antenna stage 10 using the first amplifier 120.

An example of the first amplifier 120 may include a low noise amplifier. A signal received at a receive stage of an RF signal processing circuit has a very low power level due to an influence of attenuation or noise. Therefore, it is required to amplify RF signals (signals within first and second frequency bands in the present disclosure) that are input. In this case, since the RF signals are transferred from an external source in a state in which they include much noise, a function that minimizes the noise to amplify the RF signals is required above all things.

Therefore, the first amplifier 120 may be designed by designating an operating point and a matching point so that a noise factor NF is low, and consequently, may amplify the signal within the first frequency band provided through the first antenna stage 10.

Meanwhile, the signal within first frequency band may be a signal within a band of 5 GHz by way of example.

The second amplifying unit 200 may be connected to a second antenna stage 11 and may amplify a signal within a second frequency band provided by the second antenna stage 11. The second amplifying unit 200 may also perform a switching operation in response to a control signal provided by the switching control unit 300 so as to transmit and receive the signal within the second frequency band.

More specifically, the second amplifying unit 200 may include a second switching unit 210 and a second amplifier 220. The second switching unit 210 may be positioned between the second antenna stage 11 and the second amplifier 220 and may select transmission and reception paths Tx_2 and Rx_2 of the signal within the second frequency band through a switching operation.

An example of the second amplifier 220 may include a low noise amplifier and a description overlapped with that of the first amplifier 120 will be omitted.

Therefore, the second amplifier 220 may also be designed by designating an operating point and a matching point so that a noise factor NF is low in the same as the first amplifier 120, and consequently, may amplify the signal within the second frequency band provided through the second antenna stage 11 using the second amplifier 220.

Meanwhile, the signal within the second frequency band may be a signal within a band of 2.4 GHz by way of example.

The switching control unit 300 may receive a plurality of control voltages from an external source. In this case, the plurality of control voltages may include first to fourth control voltages VC1, VC2, VC3, and VC4. Hereinafter, a case in which the plurality of control voltages include the first to fourth control voltages VC1, VC2, VC3, and VC4 will be described.

The first to fourth control voltages VC1, VC2, VC3, and VC4 may be formed by binary bits 0 and 1. The switching control unit 300 may receive the first to fourth control voltages VC1, VC2, VC3, and VC4 from an external source so as to generate a control signal to activate at least one of the first amplifying unit and the second amplifying unit 100 and 200.

The first switching unit and the second switching unit 110 and 210 that receive the control signal may control an operation of the first amplifying unit 100 or the second amplifying unit 200 in response to the control signal.

That is, if it is required to transmit the signal within the first frequency band, the first amplifying unit 100 may be activated by receiving the control signal corresponding to the signal within the first frequency band, and on the contrary, the second amplifying unit 200 may be inactivated. The activated first amplifying unit 100 may conduct the transmit path Tx_1 of the signal within the first frequency band through the switching operation of the first switching unit 110 so as to output the signal within the first frequency band through the first antenna stage 10.

A generation of the control signal by the switching control unit 300 will be described in more detail with reference to FIGS. 2 and 3.

Figure 2:
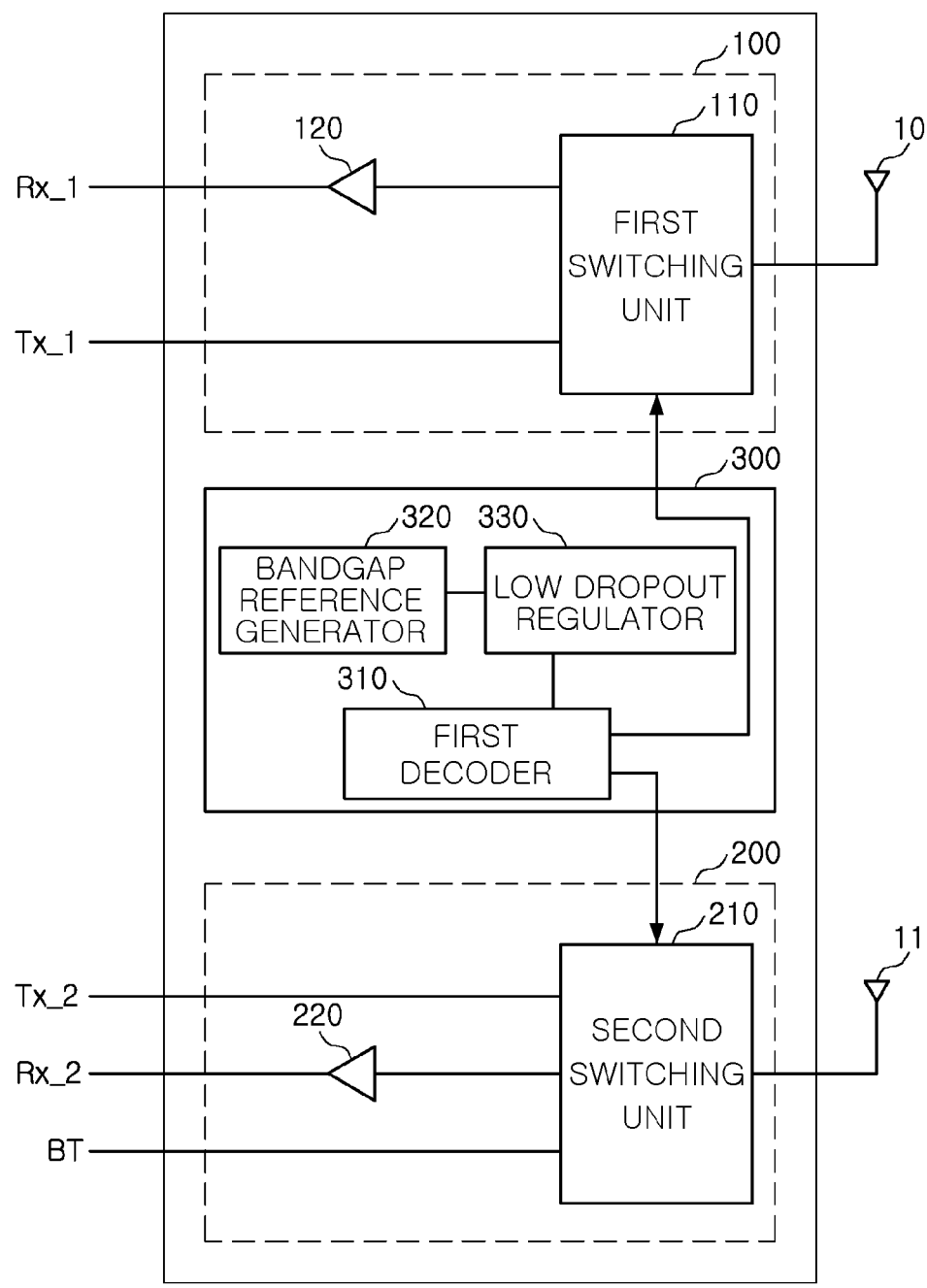
FIG. 2 is a block diagram illustrating the multi-band amplifier shown in FIG. 1 in more detail.

FIG. 2 is a block diagram illustrating the multi-band amplifier shown in FIG. 1 in more detail.

Referring to FIG. 2, the switching control unit 300 of the configurations of the multi-band amplifier according to the present disclosure may further include a bandgap reference generator 320 generating a reference voltage, a low dropout regulator (LOD) 330 electrically connected to the bandgap reference generator and generates an output voltage by dropping an input voltage so as to correspond to the reference voltage, and a first decoder 310 that receives the plurality of control voltages from an external source so as to generate a control signal.

Meanwhile, the multi-band amplifier according to the present disclosure may have the first amplifying unit and the second amplifying unit 100 and 200 and the switching control unit 300 that are formed in a single module and electrically connected to each other on a single substrate.

The following table 1 illustrates contents obtained by comparing die sizes in cases in which two single-band LNA/SWs according to the related art are used and the multi-band amplifier according to the present disclosure is used in the first and second frequency bands (2.4 GHz and 5 GHz).

TABLE 1

|  | Single-band * 2 | Multi-band Amplifier (Present Disclosure) |
| --- | --- | --- |
| Die Size Reduction Ratio of Area | 1.306 mm² | 1.015 mm² 22% |

It may be seen from Table 1 that the multi-band amplifier according to the present disclosure has a die size reduced by as much as 22% as compared to the case in which the LNA/SW for each frequency band is each used.

However, the multi-band amplifier according to the present disclosure needs to maintain an isolation spaced distance between the signal transfer paths of the first amplifier 100 and the second amplifier 200, respectively. Therefore, in order to significantly reduce the size of the die upon designing an integrated chip (IC) and decrease signal interference between the first amplifying unit and the second amplifying unit 100 and 200, the switching control unit 300 may be positioned at the middle between the first amplifying unit and the second amplifying unit 100 and 200.

In order for the multi-band amplifier according to the present disclosure to support both a transmit and receive mode and a Bluetooth mode of the first frequency band (5 GHz) signal and the second frequency band (2.4 GHz) signal, it is required to generate the control signals suitable for the transmit and receive mode and the Bluetooth mode.

In this case, there is a need to support a plurality of operation modes only by using a minimum control voltage, and consequently, the first decoder 310 according to the present disclosure may be implemented in a binary to decimal technique. That is, the first decoder 310 may generate the control signals that consist of a plurality of bits different from each other depending on the first to fourth control voltages VC1, VC2, VC3, and VC4 that are provided by an external source. In this case, the number of control signals is 8.

This will be described with reference to FIG. 3 and the following Table 2.

The following Table 2 illustrates that the first decoder 310 provided with the first to fourth control voltages VC1, VC2, VC3, and VC4 generates the 8 control signals that correspond to the respective operation modes.

TABLE 2

| Binary | | | | | |
| --- | --- | --- | --- | --- | --- |
| VC1 | VC2 | VC3 | VC4 | Decimal | Mode |
| 1 | 0 | 0 | 0 | 8 | BT (Tx) |
| 0 | 1 | 1 | 1 | 7 | Rx_5G (LNA) |
| 0 | 1 | 1 | 0 | 6 | Rx_5G (Bypass) |
| 0 | 1 | 0 | 1 | 5 | N/A |
| 0 | 1 | 0 | 0 | 4 | Tx_5G |
| 0 | 0 | 1 | 1 | 3 | Rx_2.4G (LNA) |
| 0 | 0 | 1 | 0 | 2 | Rx_2.4G (Bypass) |
| 0 | 0 | 0 | 1 | 1 | Tx_2.4G |
| 0 | 0 | 0 | 0 | 0 | All off |

Figure 3:
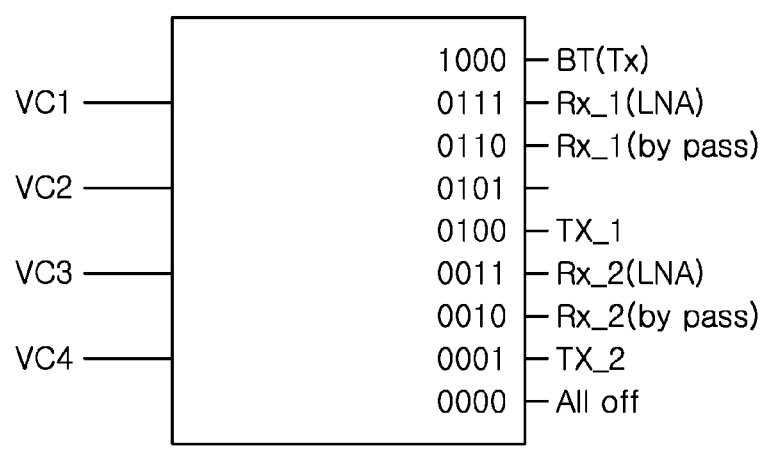
FIG. 3 is a block diagram illustrating a first decoder of configurations of the multi-band amplifier according to an exemplary embodiment in the present disclosure.

Referring to FIG. 3 and Table 2, the multi-band amplifier according to the present disclosure supports 8 modes using the four control voltages VC1, VC2, VC3, and VC4.

Thereby, the amplifying units of the two frequency bands (first and second frequency bands) may be simultaneously controlled. In addition, since the paths Tx_1 and Tx_2/Rx_1 and Rx_2 of the signals within the two frequency bands are provided independently from each other, one of the paths of the signals within the two frequency bands is not selected, but each of the paths of the signals within the two frequency bands may be operated as an incorporated control through the first decoder 310.

Meanwhile, referring to FIG. 3 and Table 2, one of the 8 control signals is a Bluetooth signal, and a technique that independently operates a VC1 terminal may be adopted, by way of example.

The low noise amplifier and switch (LNA/SW) according to the related art has three paths of Bluetooth, 2.4 G_Tx, and 2.4 G_Rx in the case of the signal within the 2.4 GHz band.

TABLE 3

|  | VC1 | VC2 | VC3 | VC4 |
|---|---|---|---|---|
| BT | 1 | 0 | 0 | 0 |
| Rx_2.4G (LNA) | 0 | 1 | 0 | 0 |
| Rx_2.4G (Bypass) | 0 | 1 | 1 | 0 |
| Tx_2.4G | 0 | 0 | 0 | 1 |
| All off | 0 | 0 | 0 | 0 |

Therefore, referring to Table 3, in order to support 5 modes of the signal within the 2.4 GHz band, 4 control voltages are required.

Meanwhile, since the signal within the 5 GHz band has two paths of 5 G_Tx and 5 G_Rx, it is required to support a total of three modes (see Table 4).

TABLE 4

|  | VC1 | VC2 | VC3 |
|---|---|---|---|
| Rx_5G (LNA) | 1 | 0 | 0 |
| Rx_5G (Bypass) | 1 | 1 | 0 |
| Tx_5G | 0 | 0 | 1 |

Referring to Table 4, in order to support 3 modes of the signal within the 5 GHz band, a total of 3 control voltages are required.

That is, in the case in which the single-band LNA/SW is used as in the above Table 2 and Table 3, a total of 7 control voltages are required.

On the contrary, the multi-band amplifier according to the present disclosure may support 15 modes only by using the 4 control voltages and may also significantly reduce the use of a bypass capacitor necessary for a control terminal to which the control voltages are provided.

Figure 4:
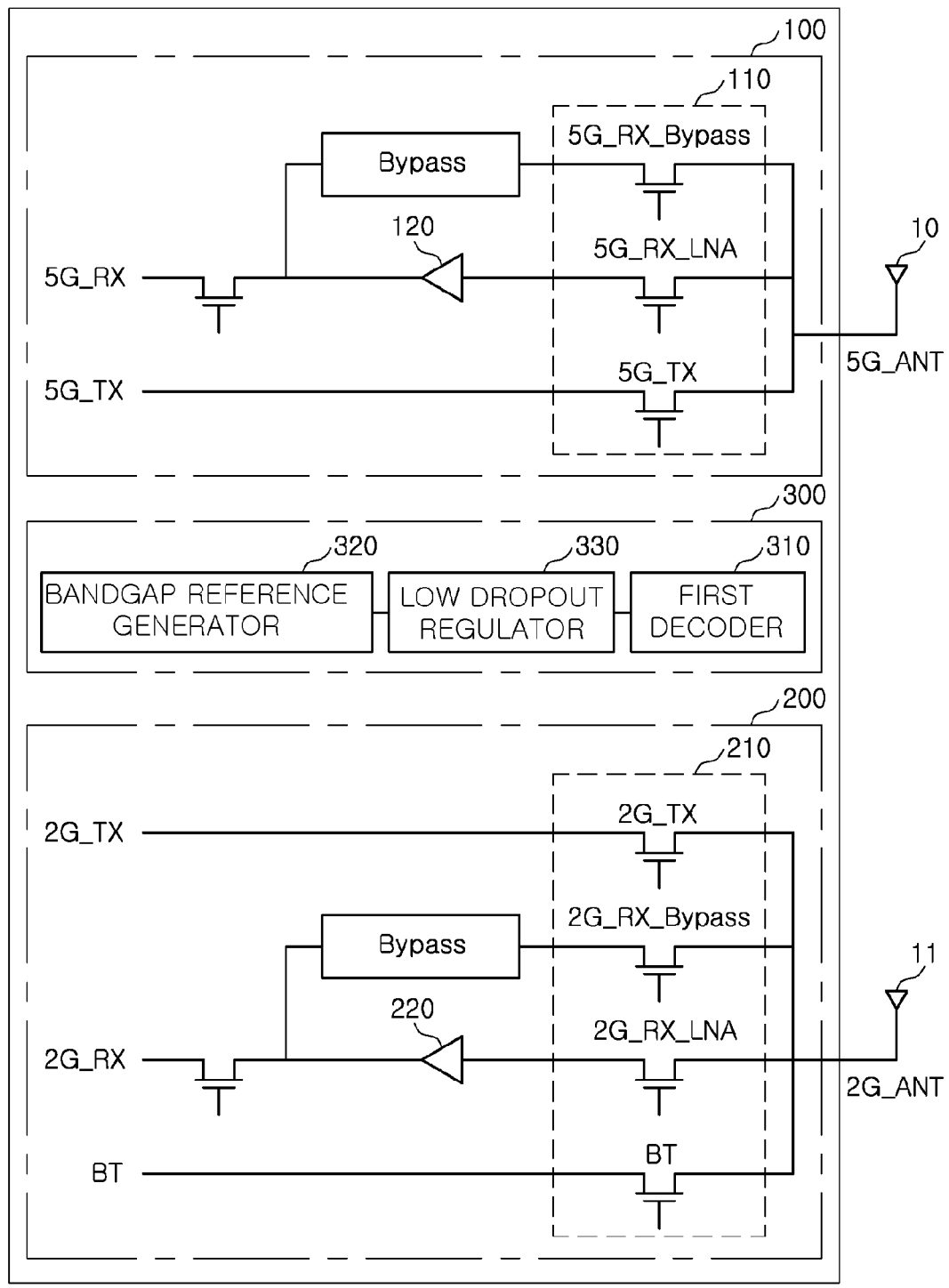
FIG. 4 is a circuit diagram illustrating the multi-band amplifier according to an exemplary embodiment in the present disclosure.

FIG. 4 is a circuit diagram illustrating the multi-band amplifier according to an exemplary embodiment in the present disclosure.

Referring to FIG. 4, the switching control unit 300 of the configurations of the multi-band amplifier according to the present disclosure may include a bandgap reference (BGR) generator 320 and a low dropout (LDO) regulator 330.

Since the single-band LNA/SW according to the related art has the two frequency bands (2.4 GHz and 5 GHz) that are separately separated from each other, two bandgap reference generators and two low dropout regulators are required. On the contrary, the multi-band amplifier according to the present disclosure may control all of the two amplifying units 100 and 200, respectively, using one bandgap reference (BGR) generator 320 and one low dropout (LDO) regulator 330.

Figure 5:
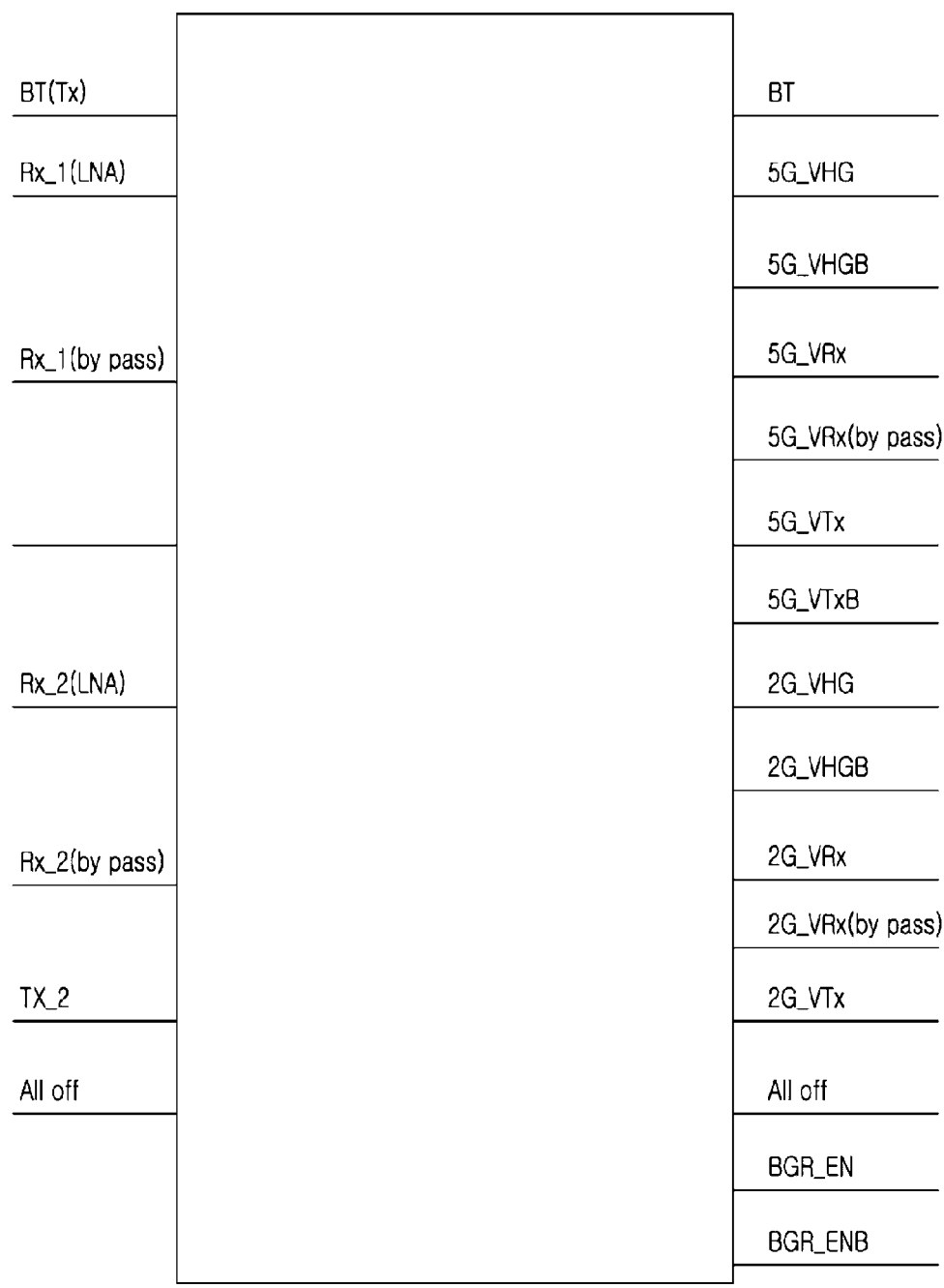
FIG. 5 is a block diagram illustrating a second decoder of the configurations of the multi-band amplifier according to an exemplary embodiment in the present disclosure.

FIG. 5 is a block diagram illustrating a second decoder of the configurations of the multi-band amplifier according to an exemplary embodiment in the present disclosure.

Referring to FIG. 5, the multi-band amplifier according to the present disclosure may support various modes necessary for an overall operation by generating 15 control signals using 8 control signals that are generated through the second decoder.

More specifically, the multi-band amplifier according to the present disclosure may further include the second decoder generating first to fifteenth control signals using the first to eighth control signals that are generated from the first decoder 310.

Particularly, the second decoder may generate the first to fifteenth control signals capable of supporting various modes so as to independently operate the block of each of the first amplifying unit 100 and the second amplifying unit 200 and may provide the first to fifteenth control signals to the first switching unit and the second switching unit 110 and 210.

For example, in the case (Rx_5 G (LNA)) of the LNA mode of the first frequency band, it is required to activate an Rx_5 G path and to operate the bandgap reference generator 320 and the low dropout regulator 330 in order to perform the LNA mode operation. In this case, the Rx_2.4 G path of the second frequency band needs to be maintained in an off-state.

That is, the multi-band amplifier according to the present disclosure may control both the first amplifying unit and the second amplifying unit 100 and 200 by generating the plurality of control signals using the first to fourth control voltages VC1, VC2, VC3, and VC4 that are provided to the switching control unit 300.

Figure 6:
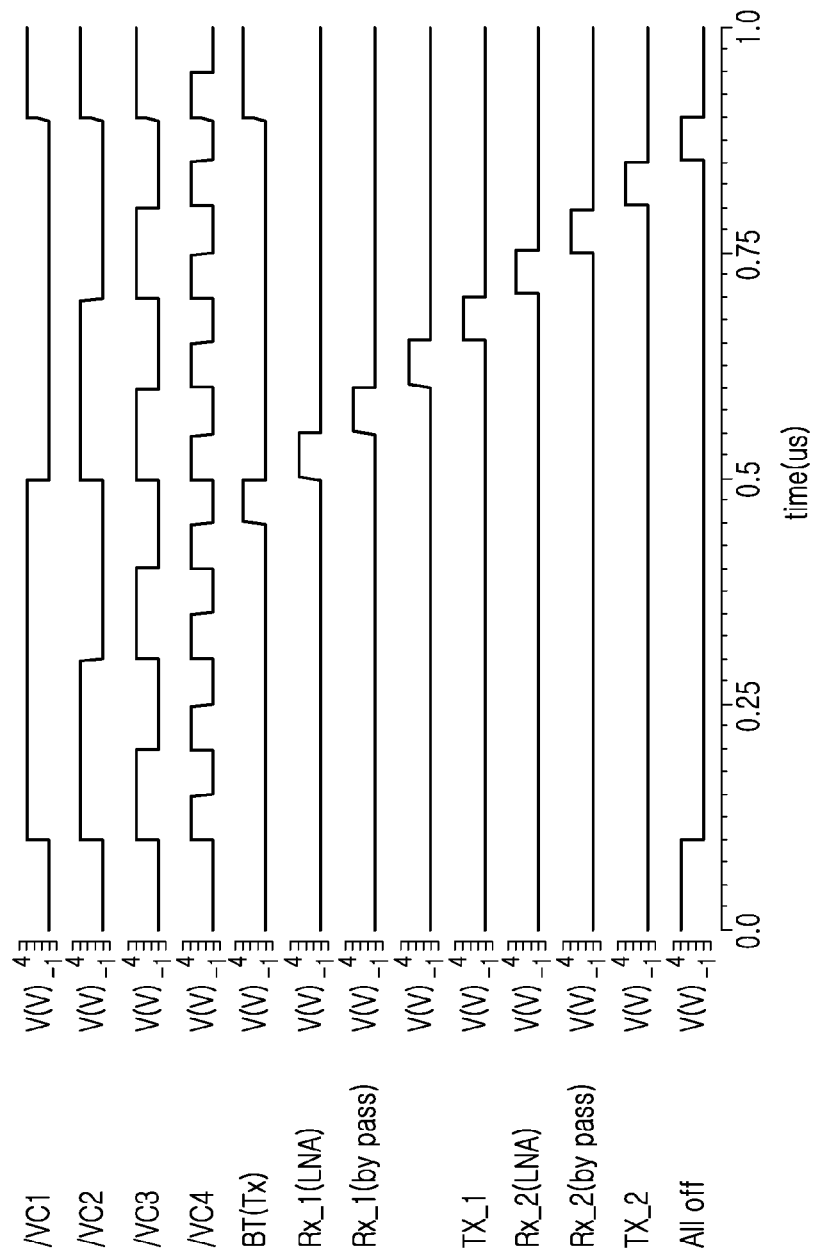
FIG. 6 is a diagram illustrating that the multi-band amplifier according to the present disclosure generates 8 control signals using 4 control voltages.

FIG. 6 is a diagram illustrating that the multi-band amplifier according to the present disclosure generates 8 control signals using 4 control voltages.

Referring to FIG. 6, it may be seen that the 8 control signals that the four control voltages VC1, VC2, VC3, and VC4 provided to the switching control unit 300 of the multi-band amplifier according to the present disclosure, and more particularly, to the first decoder 310 correspond to the 8 modes are generated.

Figure 7:
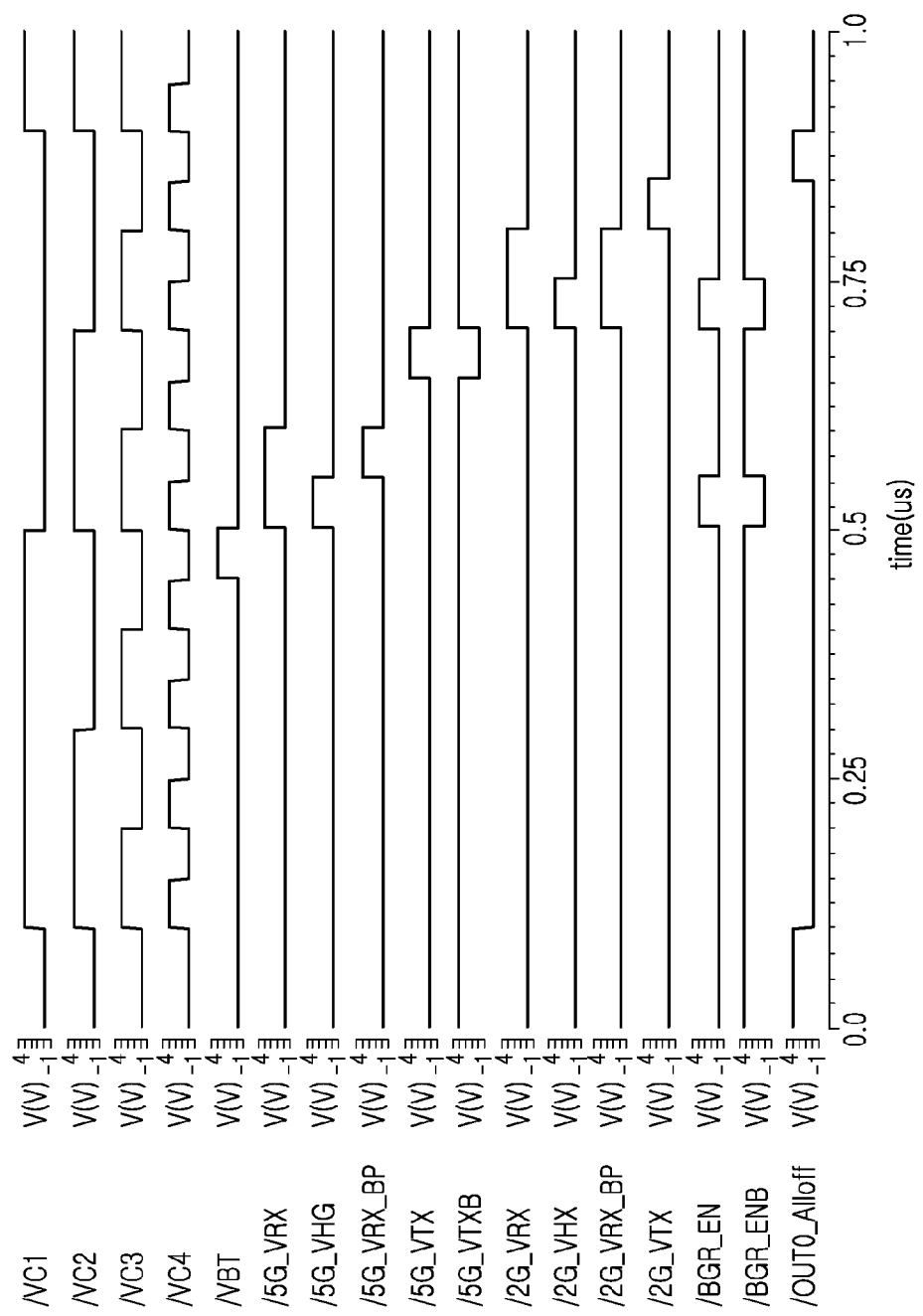
FIG. 7 is a diagram illustrating that 15 control signals are generated using the 8 control signals generated in FIG. 6.

FIG. 7 is a diagram illustrating that 15 control signals are generated using the 8 control signals generated in FIG. 6.

In addition, referring to FIG. 7, it may be seen that the 15 control signals necessary for an operation of the multi-band amplifier according to the present disclosure are generated using the 8 control signals that are output from the first decoder 310.

Figure 8:
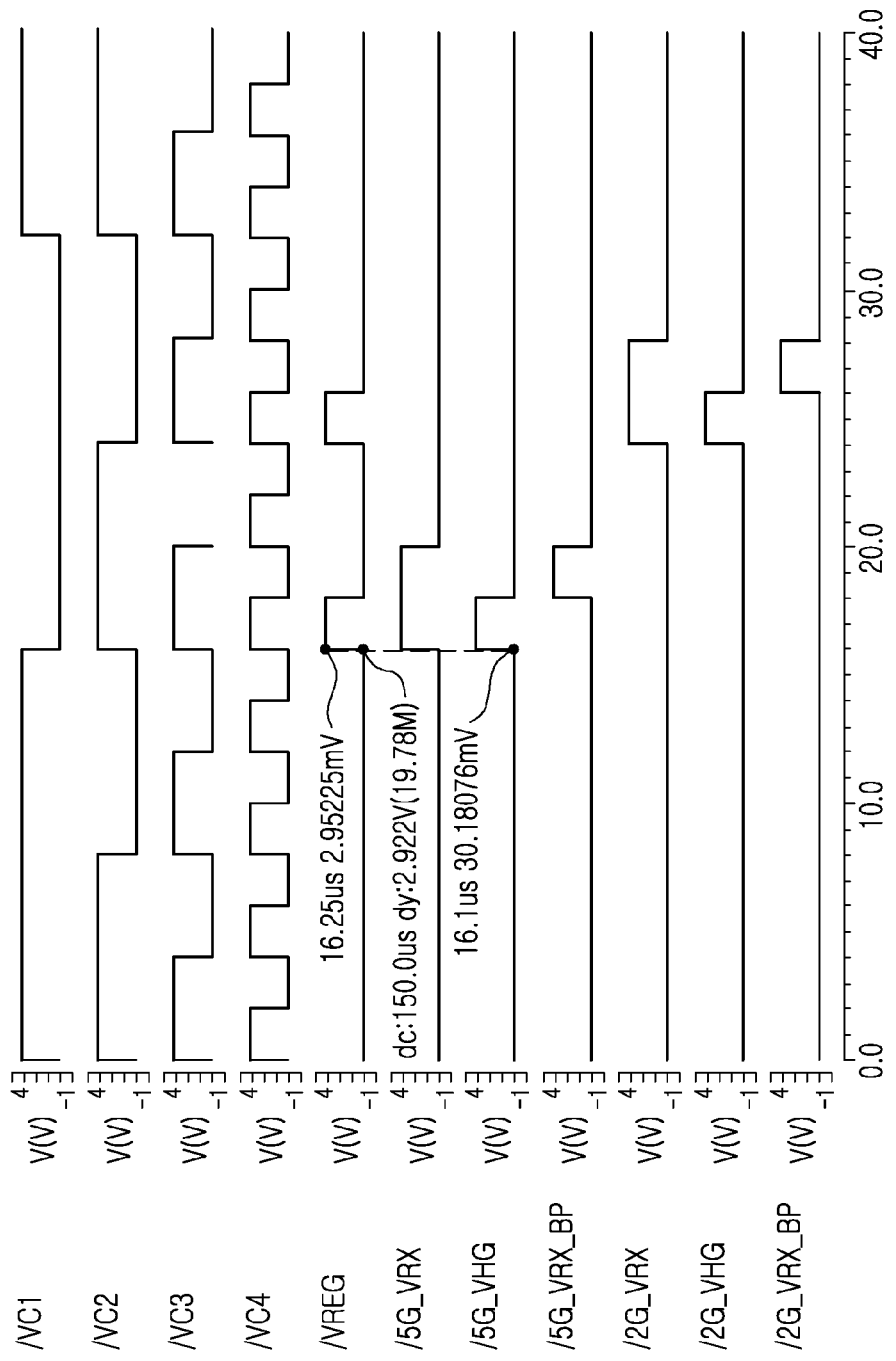
FIG. 8 illustrates a result obtained by performing a simulation up to a time at which an output voltage of a low dropout regulator 330 is generated when an LNA mode is activated using the control signals generated in FIG. 7.

FIG. 8 illustrates a result obtained by performing a simulation up to a time at which an output voltage of the low dropout regulator 330 is generated when an LNA mode is activated using the control signals generated in FIG. 7.

As described above byway of example, in the case (Rx_5 G (LNA)) of the LNA mode of the first frequency band, it is required to activate the Rx_5 G path and to operate the bandgap reference generator 320 and the low dropout regulator 330 in order to perform the LNA mode operation.

In this case, it may be seen that after the bandgap reference generator 320 is activated, that is, after 150 ns, a voltage of 2.9V is output.

That is, a current which is consumed by the switching control unit 300 of the multi-band amplifier according to the present disclosure is about 750 μA. In this case, a current which is used in the first decoder 310 is about 0.125 μA. That is, it may be seen that there is no a significant variation in the current consumption of the multi-band amplifier according to the present disclosure even in the case in which the first decoder 310 is added to be used.

FIG. 9A is a table comparing results obtained by simulating a multi-band amplifier according to an exemplary embodiment in the present disclosure and an amplifier (LNA/SW) according to the related art at a signal within the 2.4 GHz band.

Referring to FIG. 9A, it may be seen that the multi-band amplifier according to the present disclosure shows the same level of operation characteristics as an amplifier according to the related art, that is, the single-band LNA/SW in the second frequency band (2.4 GHz).

FIG. 9B is a table comparing results obtained by simulating the multi-band amplifier according to an exemplary embodiment in the present disclosure and the amplifier (LNA/SW) according to the related art at a signal within 5 GHz.

Referring to FIG. 9B, it may be seen that the multi-band amplifier according to the present disclosure has a reduced gain in the LNA mode as in the second frequency band (2.4 GHz).

Figure 10A:
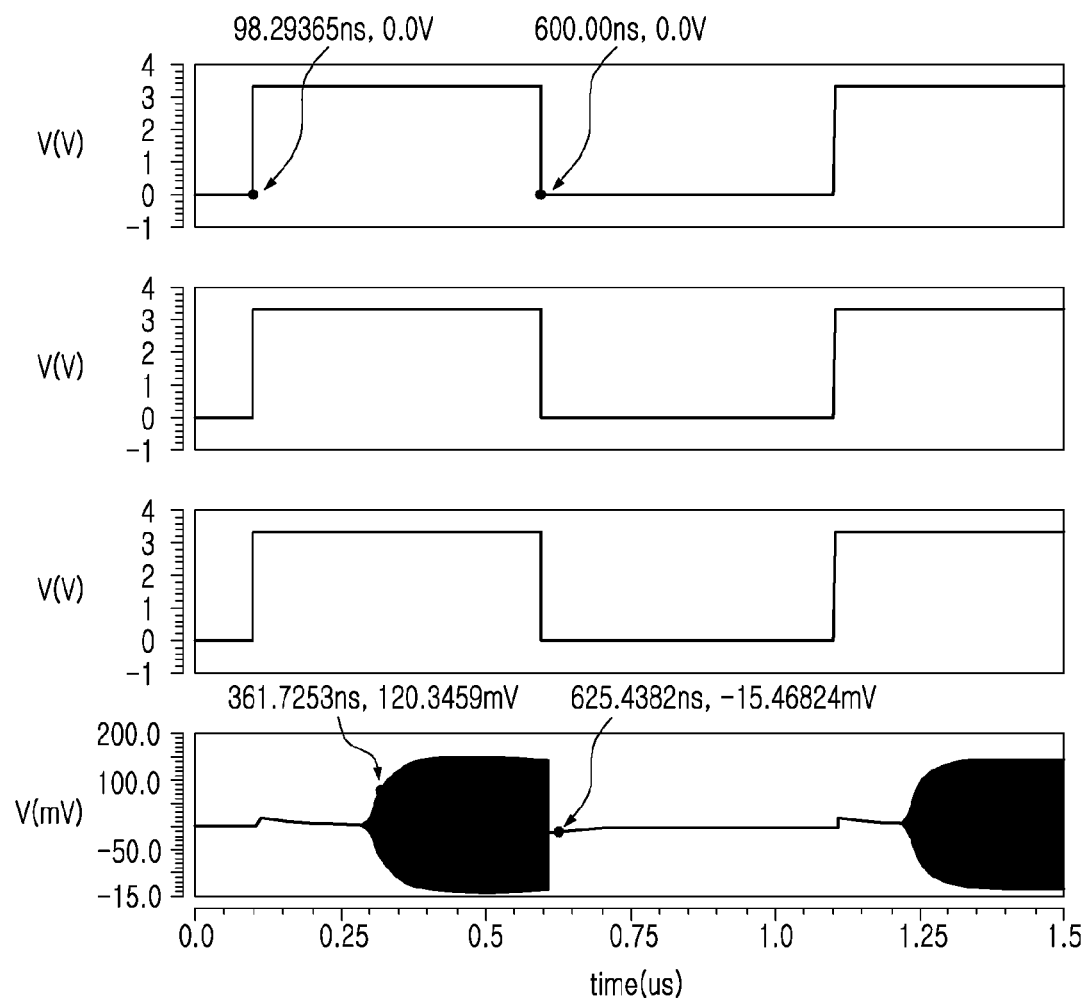
FIG. 10A is a graph illustrating a startup time when the multi-band amplifier according to an exemplary embodiment in the present disclosure is operated in an Rx_5 G (LNA) mode.

FIG. 10A is a graph illustrating a startup time when the multi-band amplifier according to an exemplary embodiment in the present disclosure is operated in an Rx_5 G (LNA) mode.

Figure 10B:
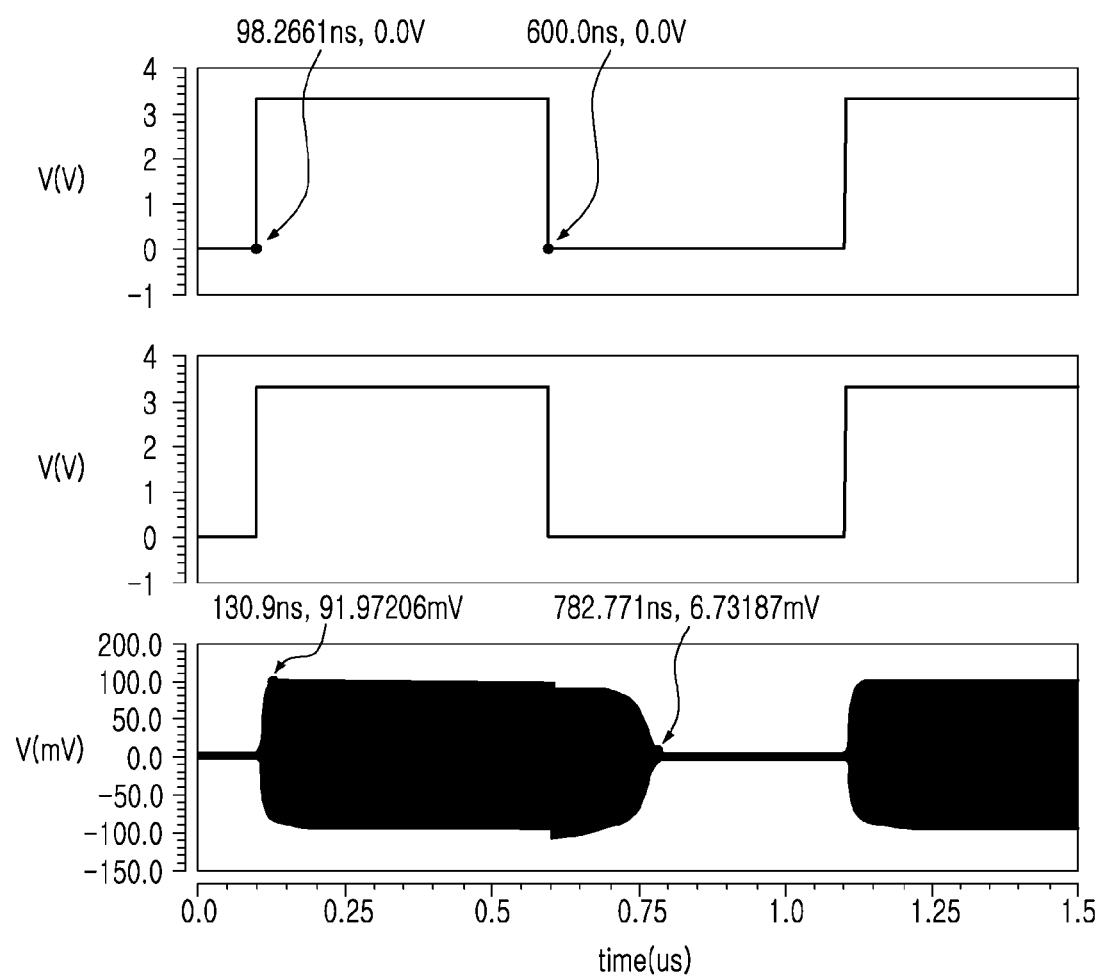
FIG. 10B is a graph illustrating a startup time when the multi-band amplifier according to an exemplary embodiment in the present disclosure is operated in an Rx_5 G (bypass) mode.

FIG. 10B is a graph illustrating a startup time when the multi-band amplifier according to an exemplary embodiment in the present disclosure is operated in an Rx_5 G (bypass) mode.

Figure 10C:
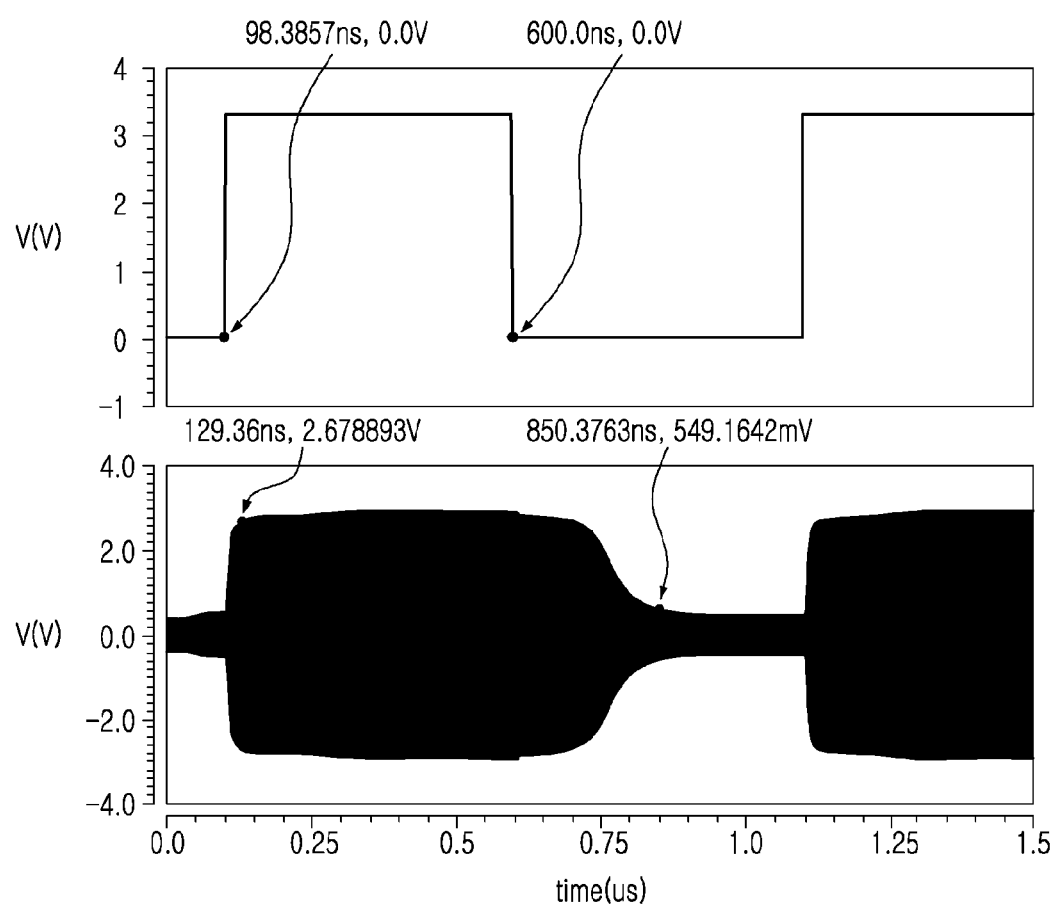
FIG. 10C is a graph illustrating a startup time when the multi-band amplifier according to an exemplary embodiment in the present disclosure is operated in a Tx_5 G mode.

FIG. 10C is a graph illustrating a startup time when the multi-band amplifier according to an exemplary embodiment in the present disclosure is operated in a Tx_5 G mode.

Referring to FIG. 10A, it may be seen that the multi-band amplifier according to the present disclosure outputs a voltage of the bandgap reference generator 320 after 150 ns in the Rx_5 G (LNA) mode.

Therefore, it may be seen that the multi-band amplifier according to the present disclosure has the startup time of 260 ns in the Rx_5 G (LNA) mode.

The startup time which is currently required for the switch in a Wi-Fi module is 400 ns that is a time necessary to change magnitude of a RF signal from 10% to 90% and from 90% to 10%.

Therefore, referring to FIGS. 10A, 10B, and 10C, it may be seen that the multi-band amplifier according to the present disclosure satisfies startup time characteristics.

Figure 11:
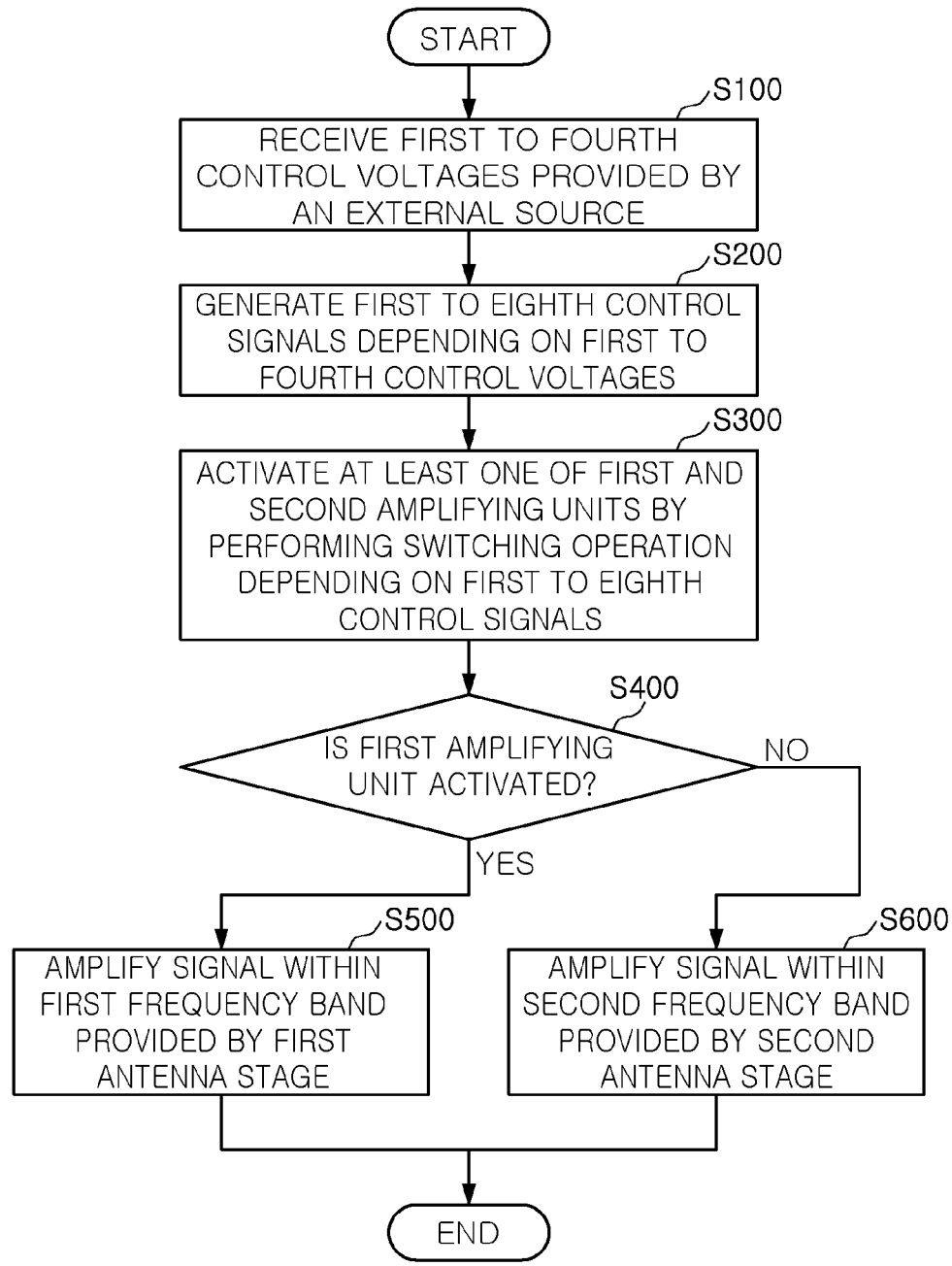
FIG. 11 is a flowchart illustrating a method for controlling a multi-band amplifier according to another exemplary embodiment in the present disclosure.

FIG. 11 is a flowchart illustrating a method for controlling a multi-band amplifier according to another exemplary embodiment in the present disclosure.

Referring to FIG. 11, a method for controlling a multi-band amplifier according to another exemplary embodiment in the present disclosure may include receiving first to fourth control voltages from an external source (S100), generating first to eighth control signals depending on the first to fourth control voltages (S200), activating at least one of first amplifying unit and the second amplifying unit 100 and 200 by performing a switching operation depending on the first to eighth control signals (S300), and confirming whether or not the first amplifying unit 100 is activated (S400).

If the first amplifying unit 100 is activated, a signal within a first frequency band that is provided by a first antenna stage 10 is amplified (S500), and if the second amplifying unit 200 is activated, a signal within a second frequency band that is provided by a second antenna stage 11 is amplified (S600).

Meanwhile, the method for controlling the multi-band amplifier according to the present disclosure may further include generating first to fifteenth control signals at a second decoder by receiving first to eighth control signals if the first to eighth control signals are generated by the first decoder 310.

Figure 12:
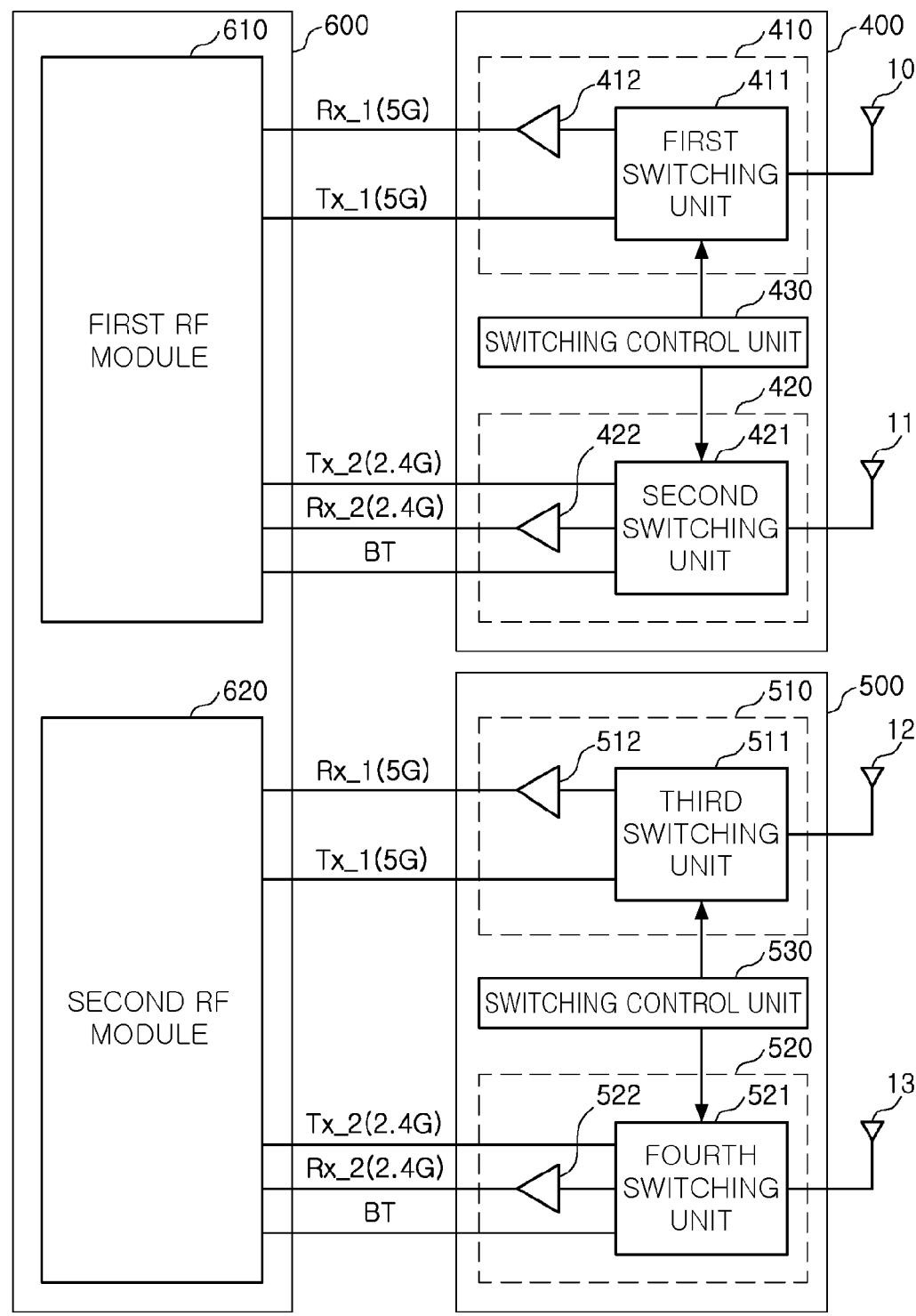
FIG. 12 is a block diagram illustrating a multi-band amplifier for a MIMO system according to another exemplary embodiment in the present disclosure.

FIG. 12 is a block diagram illustrating a multi-band amplifier for a MIMO system according to another exemplary embodiment in the present disclosure.

Referring to FIG. 12, a multi-band amplifier of a MIMO system according to the present disclosure may include a first amplifying module 400, a second amplifying module 500, and a wireless communications module 600.

The first amplifying module 400 may include a first amplifying unit 410 amplifying a signal within a first frequency band provided by a first antenna stage 10, a second amplifying unit 420 amplifying a signal within a second frequency band provided by a second antenna stage 11, and a first switching control unit 430 generating a plurality of first unit control signals to activate at least one of the first amplifying unit and the second amplifying unit 410 and 420 depending on a plurality of first unit control voltages.

The first amplifying unit 410 may amplify the signal within the first frequency band provided by the first antenna stage 10 by performing a switching operation depending on the first unit control signal and the second amplifying unit 420 may amplify the signal within the second frequency band provided by the second antenna stage 11 by performing the switching operation depending on the first unit control signal.

The second amplifying module 500 may include a third amplifying unit 510 amplifying a signal within a first frequency band provided by a third antenna stage 12, a fourth amplifying unit 520 amplifying a signal within a second frequency band provided by a fourth antenna stage 13, and a second switching control unit 530 generating a plurality of second unit control signals to activate at least one of the third and fourth amplifying units 510 and 520 depending on a plurality of second unit control voltages.

The third amplifying unit 510 may amplify the signal within the first frequency band provided by the third antenna stage 12 by performing a switching operation depending on the second unit control signal and the fourth amplifying unit 520 may amplify the signal within the second frequency band provided by the fourth antenna stage 13 by performing the switching operation depending on the second unit control signal.

The wireless communications module 600 may be electrically connected to the first amplifying module 400 and the second amplifying module 500 so as to transmit and receive the signals within the first and second frequency bands.

More particularly, the wireless communications module 600 may include a first RF module 610 and a second RF module 620, wherein the first RF module 610 may be connected to the first amplifying module 400 so as to transmit and receive the signals within the first and second frequency bands. In addition, the second RF module 620 may be connected to the second amplifying module 500 so as to transmit and receive the signals within the first and second frequency bands.

That is, the two RF modules 610 and 620 in the wireless communications module 600 may be each connected to the first amplifying module 400 and the second amplifying module 500 so as to configure a 2×2 MIMO system.

In this case, the plurality of first and second unit control voltages may include 4 control voltages VC1, VC2, VC3, and VC4, and each of the first switching control unit and the second switching control unit 430 and 530 may further include a first decoder 310 generating 8 control signals that consist of a plurality of bits different from each other by receiving the first to fourth control voltages VC1, VC2, VC3, and VC4.

In addition, each of the first switching control unit and the second switching control unit 430 and 530 may further include a bandgap reference generator 320 generating a reference voltage and a low dropout regulator 330 that is electrically connected to the bandgap reference generator 320 and generates an output voltage by dropping an input voltage so as to correspond to the reference voltage.

Meanwhile, the signal within the first frequency band may be a signal within a band of 5 GHz and the signal within the second frequency band may be a signal within a band of 2.4 GHz.

Referring to FIG. 12, the multi-band amplifier for the MIMO system according to the present disclosure may be used even in a MIMO environment of a 2×2 environment. That is, compared to the related art, the multi-band amplifier of the MMO system according to the present disclosure may significantly reduce the number of control voltages provided by an external source to 4, and consequently, may also significantly reduce the use of a bypass capacitor necessary for a control voltage terminal.

As set forth above, according to exemplary embodiments of the present disclosure, the multi-band amplifier, the method for controlling thereof, and the multi-band amplifier for the MIMO system may control transmission and reception of the signals within the two frequency bands using the minimum control voltage, whereby the number of bypass capacitors may be significantly decreased.

In addition, components are modularized in a single substrate, whereby a chip area may be reduced.

While exemplary embodiments have been shown and described above, it will be apparent to those skilled in the art that modifications and variations could be made without departing from the scope of the present invention as defined by the appended claims.

What is claimed is:

1. A multi-band amplifier, comprising:
   a first amplifying unit connected to a first antenna stage so as to transmit and receive a signal within a first frequency band;
   a second amplifying unit connected to a second antenna stage so as to transmit and receive a signal within a second frequency band; and
   a switching control unit configured to generate first and second control signals based on common control voltages, and to output the first control signal to the first amplifying unit and output the second signal to the second amplifying unit,
   wherein the first amplifying unit configured to amplify the signal within the first frequency band, and to alternate transmitting and receiving the signal within the first frequency band by performing a switching operation depending on the first control signal, and
   the second amplifying unit configured to amplify the signal within the second frequency band, and to alternate transmitting and receiving the signal within the second frequency band by performing a switching operation depending on the second control signal.

2. The multi-band amplifier of claim 1, wherein the switching control unit includes a first decoder generating the first and second control signals by receiving the common control voltages.

3. The multi-band amplifier of claim 2, wherein the common control voltages include first to fourth control voltages, and the first decoder generates 8 control signals that consist of a plurality of bits different from each other depending on the first to fourth control voltages.

4. The multi-band amplifier of claim 3, wherein the 8 control signals include a Bluetooth control signal, and
   the second amplifying unit provides a Bluetooth signal through the second antenna stage by receiving the Bluetooth control signal.

5. The multi-band amplifier of claim 1, wherein the first amplifying unit includes:
   a first amplifier configured to amplify the signal within the first frequency band in a receive path of the signal within the first frequency band; and
   a first switching unit configured to transmit and receive the signal within the first frequency band through a switching operation between the first antenna stage and a transmission and reception path of the signal within the first frequency band, and the second amplifying unit includes:
   a second amplifier configured to amplify the signal within the second frequency band in a receive path of the signal within the second frequency band; and
   a second switching unit configure to transmit and receive the signal within the second frequency band or a Bluetooth signal through a switching operation between a transmission and reception path of the signal within the second frequency band and the Bluetooth signal and the second antenna stage.

6. The multi-band amplifier of claim 1, wherein the signal within the first frequency band is a signal within a band of 5 GHz, and the signal within the second frequency band is a signal within a band of 2.4 GHz.

7. The multi-band amplifier of claim 1, wherein the first amplifying unit, the second amplifying unit, and the switching control unit are electrically connected to one another on one substrate, and
   the switching control unit is positioned between the first amplifying unit and the second amplifying unit.

8. A multi-band amplifier of a multiple-input and multiple-output (MIMO) system, the multi-band amplifier comprising:
   a first amplifying module including a first amplifying unit configured to amplify a signal within a first frequency band provided by a first antenna stage, a second amplifying unit configured to amplify a signal within a second frequency band provided by a second antenna stage, and a first switching control unit configured to generate a first unit control signal to activate at least one of the first amplifying unit and the second amplifying unit depending on a plurality of first unit control voltages;
   a second amplifying module including a third amplifying unit configured to amplify a signal within a first frequency band provided by a third antenna stage, a fourth amplifying unit configured to amplify a signal within a second frequency band provided by a fourth antenna stage, and a second switching control unit configured to generate a second unit control signal to activate at least one of the third amplifying unit and the fourth amplifying unit depending on a plurality of second unit control voltages; and
   a wireless communications module that is electrically connected to the first amplifying module and the second amplifying module so as to transmit and receive the signals within the first and second frequency bands,
   wherein the first amplifying unit amplifies the signal within the first frequency band provided by the first antenna stage by performing a switching operation depending on the first unit control signal and the second amplifying unit amplifies the signal within the second frequency band provided by the second antenna stage by performing a switching operation depending on the first unit control signal, and the third amplifying unit amplifies the signal within the first frequency band provided by the third antenna stage by performing a switching operation depending on the second unit control signal and the fourth amplifying unit amplifies the signal within the second frequency band provided by the fourth antenna stage by performing a switching operation depending on the second unit control signal.

9. The multi-band amplifier of claim 8, wherein the plurality of first unit control voltage and second unit control voltage that are provided to each of the first switching control unit and the second switching control unit include 4 control voltages.

10. The multi-band amplifier of claim 9, wherein the first switching control unit and the second switching control unit include a first decoder generating 8 control signals that consist of a plurality of bits different from each other by receiving the 4 control voltages.

11. The multi-band amplifier of claim 8, wherein the signal within the first frequency band is a signal within a band of 5 GHz, and the signal within the second frequency band is a signal within a band of 2.4 GHz.

12. The multi-band amplifier of claim 8, wherein each of the first switching control unit and the second switching control unit includes:
- a bandgap reference generator generating a reference voltage; and
- a low dropout regulator that is electrically connected to the bandgap reference generator and generates an output voltage by dropping an input voltage so as to correspond to the reference voltage.

* * * * *